United States Patent [19]
Belanger et al.

[11] Patent Number: 5,366,827
[45] Date of Patent: Nov. 22, 1994

[54] MODULAR HOUSING FOR BATTERIES AND BATTERY CHARGER

[75] Inventors: Daniel L. Belanger, Westford; James A. Daly, Chelsea, both of Mass.

[73] Assignee: Digital Equipment Corporation, Maynard, Mass.

[21] Appl. No.: 896,251

[22] Filed: Jun. 10, 1992

[51] Int. Cl.⁵ .............................................. H01M 2/10
[52] U.S. Cl. ......................................... 429/99; 429/98
[58] Field of Search .................................. 429/99, 98

[56] References Cited

U.S. PATENT DOCUMENTS

| | | | |
|---|---|---|---|
| 3,085,127 | 4/1963 | Loris | 429/99 |
| 3,110,634 | 11/1963 | Bradshaw | 429/99 |
| 3,903,404 | 9/1975 | Beall et al. | 235/152 |
| 5,140,744 | 8/1992 | Miller | 429/99 |
| 5,304,434 | 4/1994 | Stone | 429/99 |

FOREIGN PATENT DOCUMENTS

| | | |
|---|---|---|
| 0362083 | 4/1990 | European Pat. Off. . |
| 2601162 | 1/1988 | France . |
| 19161 | 12/1981 | Germany . |

OTHER PUBLICATIONS

Installation Drawings for HA3000 Uninterruptible Power System, Digital Equipment Corporation, 1989.
Fujitsu et al., "Battery Compartment"; Patent Abstracts of Japan vol. 10, No. 95 (E-395) (2152) Apr. 1986, & JP-A-60236454, Nov. 1985.
Shiyoujirou et al., "Battery Containment Box of Electronic Equipment"; Patent Abstracts of Japan vol. 17, No. 89 (E-1323) Feb. 1993, & JP-A-4283997 Oct. 1992.

*Primary Examiner*—David B. Springer
*Attorney, Agent, or Firm*—Cesari and McKenna

[57] ABSTRACT

A housing for batteries which may be combined with a battery charger in a mechanically integrated module. The module is mobile and includes a load-bearing frame, battery retaining members, and mechanical stabilizers. The base of the frame includes a raceway or channel for routing interconnecting wires between the charger assembly and batteries. The battery retaining members permit easy installation or removal of individual batteries from the housing as well as inhibiting lateral movement of the batteries within the housing. When the module is free-standing, the stabilizers deploy automatically for enhanced mechanical stability.

32 Claims, 7 Drawing Sheets

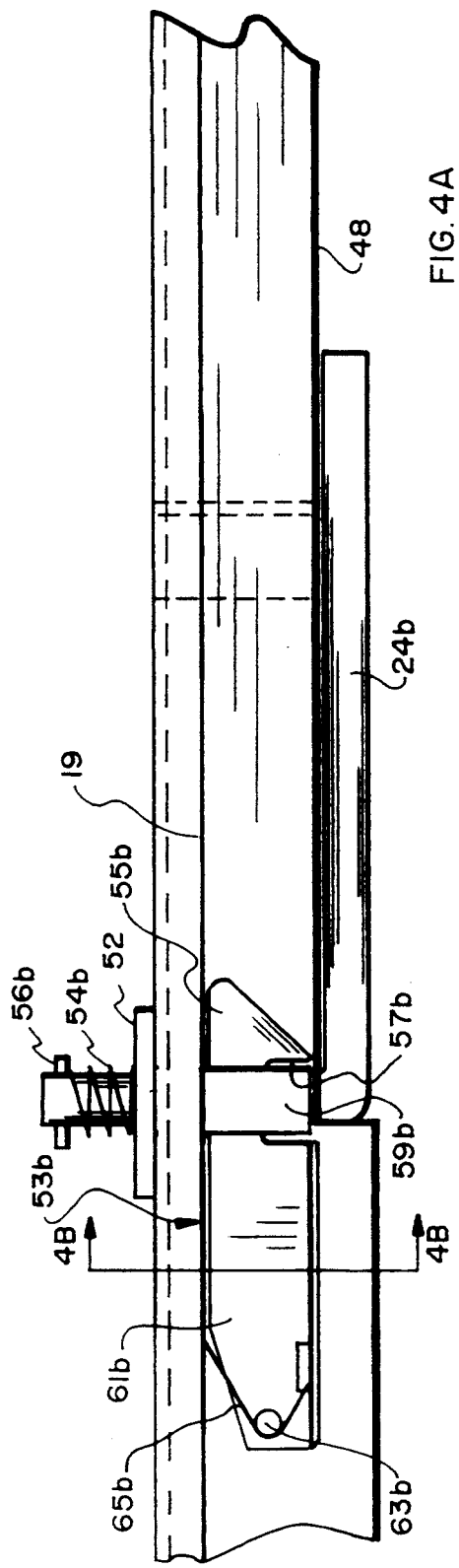
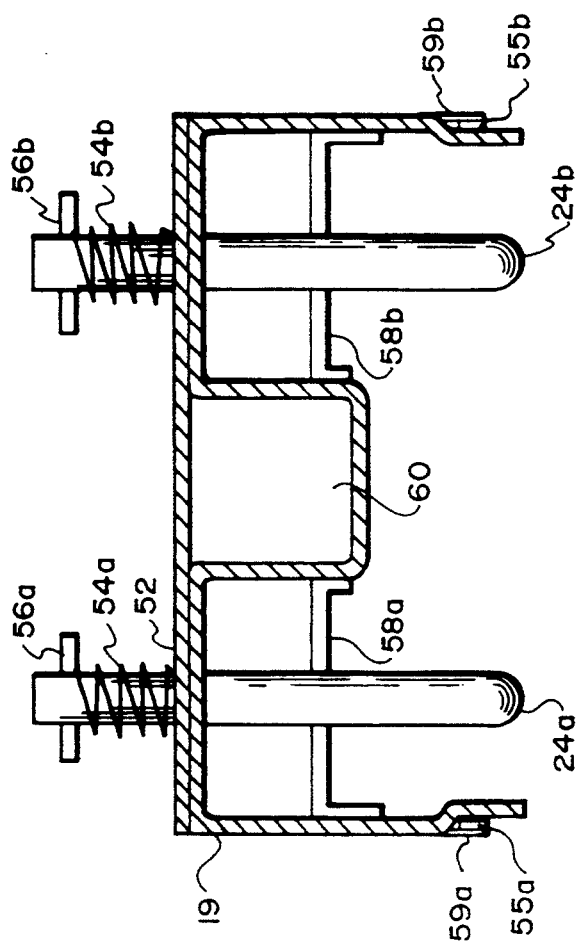

MODULAR HOUSING FOR BATTERIES AND BATTERY CHARGER

BACKGROUND OF THE INVENTION

1. Field of the Invention

The present invention relates generally to the field of battery back-up power sources for electronic equipment and, more specifically, to a modular housing for holding batteries and a battery charger which function as a battery power source.

2. Discussion of the Prior Art

Many types of electronic equipment are powered by batteries to achieve desired functionality. In smaller equipment, such as laptop computers, it is often desirable to use a battery power source for portability. Larger equipment, such as a "minicomputer" or mainframe computer, may rely on a battery power source as a back-up which is switched on-line during a failure in the primary source of supply (i.e., the local electric utility). Such "uninterruptable" power sources are thus intended to maintain a continuous supply of power in order to prevent or reduce down time of costly, critical equipment and also prevent loss of data during interruptions of utility supplied power.

However, conventional battery power sources, particularly those designed to power larger systems, often exhibit one or more of the following disadvantages. First, conventional battery sources are generally not based on a modular architecture, are often difficult to install or replace and cannot be readily interconnected to meet the power requirements of different types of equipment. Further, great difficulty and inconvenience are often encountered when attempting to install or replace individual batteries.

Second, the physical size of the battery power source is often an important consideration in many applications and conventional sources are typically large and bulky. Thus, such conventional sources may be unusable in applications having stringent space or form factor constraints.

Third, safety considerations are of paramount importance in terms of protecting personnel from injury and protecting the power source from damage, yet many conventional power sources do not adequately guard against these risks. Obviously, there is an electrical shock and energy hazard presented by any battery power source, particularly those powering larger loads which may operate at several hundred volts. Moreover, 12V batteries connected in series to produce 96V tend to be quite heavy due to their internal construction. Conventional battery power sources may not provide sufficient load-bearing capacity to combine several such batteries into a single compact package.

Lastly, many conventional battery power sources require a battery charger that is manufactured or supplied as a separate assembly which must be electrically connected with the power source. Separate chargers often represent an increased safety risk due to exposed cables needed for interconnection.

SUMMARY OF THE INVENTION

In brief summary, the present invention provides a housing for batteries which may be combined with a battery charger in a mechanically integrated module. The module permits rapid, easy installation or removal of individual batteries as well as enhanced operating safety in terms of shock protection and mechanical stability. The module is compact, easily transported and easily installed by simpling rolling the module into a cabinet and actuating an in-lock device to secure it in position.

The module includes a load-bearing frame, battery retaining members, and mechanical stabilizers and wheels attached to the base of the frame. The frame includes a number of compartments arranged in a vertical array. Several compartments are adapted to hold individual batteries and one is reserved for electrically interconnecting the batteries with an output power connector. Solid bus bars in various configurations are provided to electrically connect battery terminals to other terminals or to wires. The base of the frame includes a raceway or channel for routing interconnecting wires between the charger assembly, batteries and output power connector.

The battery-retaining members permit rapid, easy installation or removal of individual batteries from the housing as well as inhibiting lateral movement of the batteries within their respective compartments. In addition, the retaining members serve as insulators which protectively cover the battery terminals to prevent accidental contact by personnel or other equipment located in close proximity to the module.

The stabilizers deploy automatically as the module is withdrawn from its cabinet and provide mechanical stability when the module is free standing. Conversely, when the module is installed within the cabinet, the stabilizers automatically retract, thereby reducing the space occupied by the module. The in-lock device mounted on the bottom of the frame secures the module in a fixed position within the cabinet.

The battery charger assembly is pivotally mounted to one end of the module frame to allow easy access to the electrical interconnections between the batteries and charger assembly. This arrangement also permits the charger assembly to be completely removed from the frame, if desired.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4A is an enlarged side view of the stabilizer assembly of FIG. 2A in a retracted position;

FIG. 4B is a sectional view taken along line 4B—4B of FIG. 4A;

DETAILED DESCRIPTION OF AN ILLUSTRATIVE EMBODIMENT

Figure 1:
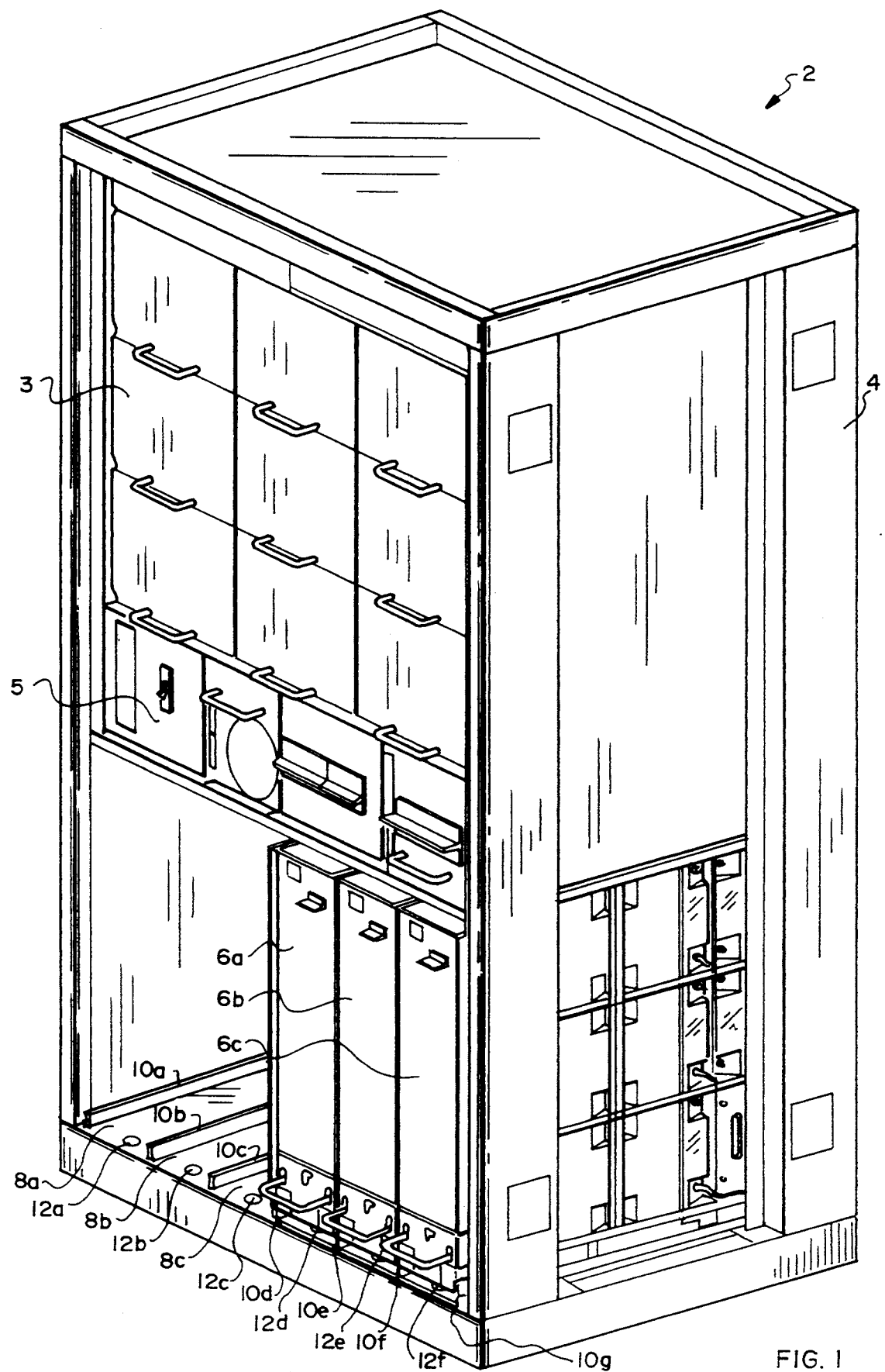
FIG. 1 is a perspective view of an uninterruptable power supply which incorporates integrated battery and battery charger modules constructed in accordance with a preferred embodiment of the present invention.

FIG. 1 shows an uninterrupted power supply (UPS) 2. The UPS 2 may be used to continuously deliver electrical power to a desired load (not shown), such as computer system, by switching from a primary power supply to a battery power source upon failure of the primary supply. The upper portion of a cabinet 4 houses several power converters which are designated generally by reference numeral 3. The power converters 3 convert AC line voltage provided by an electric power utility to appropriate voltages for powering the desired load. A series of switches, designated generally by reference numeral 5, are mounted in the middle portion of the cabinet 4. The switches 5 may operate, for example, to disconnect the AC line voltage from the UPS 2 or to disconnect the UPS 2 from the load. As the transformers 3 and switches 5 are germane to the present invention merely for purposes of demonstrating an exemplary use, they will not be discussed further.

Three integrated battery and battery charger modules 6a, 6b and 6c are shown installed in the lower portion of the cabinet 4. Guide rails 10a–10g extend upward from the interior bottom surface 11 of the cabinet 4 and define a series of "channels," each of which may accommodate a module 6. Three channels 8a, 8b and 8c are shown vacant. Either three or six modules 6 may be installed in the cabinet 4 depending upon the power requirements of the load or loads powered by the UPS 2. Other applications may, of course, present different requirements. Advantageously, each module 6 may be installed or removed independently from the other modules, thus facilitating assembly, expansion and maintenance procedures.

Apertures 12a–12f are located near the front edge of the surface 11 and are used for locking the modules 6 in place within the cabinet 4, as explained in detail below.

Figure 2A:
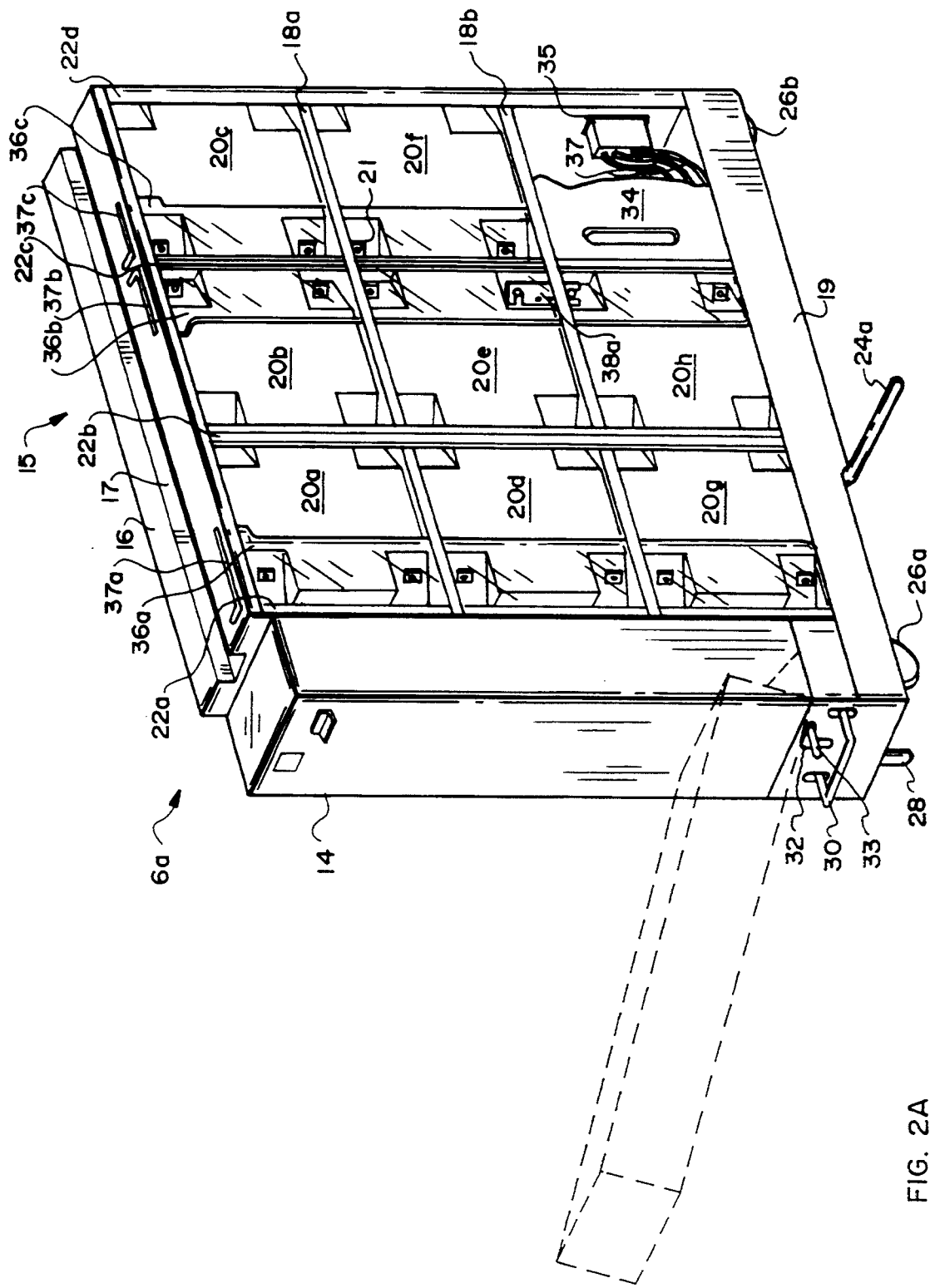
FIG. 2A is a perspective view of one of the integrated battery and battery charger modules shown in FIG. 1.

As shown in FIG. 2A, which is a perspective view of a representative one of the modules 6 of FIG. 1, a battery charger assembly 14 is mechanically coupled with a battery housing 15. Battery charger assembly 14 is preferably pivotally mounted so that the entire assembly may rotate downward, as indicated in phantom. The charger assembly 14 may also be completely removed.

The battery housing 15 includes a load-bearing frame which is formed by a top member 16, shelves 18a and 18b, a bottom member 19 and vertical supports 22a–22d. The top member 16 includes a channel 17 which increases the strength and stiffness of the member 16. In addition, the channel 17 may engage with a rail, extending downwardly from beneath the switches 5 (FIG. 1), for securing the module 6a in a fixed position when installed in the cabinet 4.

Nine rectangular compartments are defined by the load-bearing frame, eight of which house batteries 20a–20h, respectively. Each battery has external screw-type terminals, a representative one of which is denoted by reference numeral 21, which are located at two adjacent corners. The interior sidewalls and rear bottoms of the eight battery compartments may include upwardly extending flanges to provide a containment for each battery 20. To provide even greater containment of the batteries, a piece of resilient insulating material may be wedged between each battery 20 and the top of its compartment.

A panel 34, a portion of which is cut away in the drawing, covers the ninth compartment, which houses an output power connector 35. The interior side of power connector 35 is connected by wires or cables 37 to appropriate terminals on the batteries 20 and to charger assembly 14. The exterior side of connector 35 is connectable to a desired load.

Attached to the underside of the bottom member 19 are two laterally-extending stabilizers 24 (only 24a being visible in FIG. 2A), four wheels 26 (26a and 26b being visible) and a locking pin 28. A handle 30 is connected to the front of the module 6a below the battery charger assembly 14. A locking pin access aperture 32, from which a lock-actuating lever 33 protrudes, is located just above the handle 30.

Three transparent insulating and retaining members 36a, 36b and 36c are secured to the side of the battery housing 15. Member 36c is preferably shaped similarly to member 36a, but shorter in length to avoid overlapping and interfering with panel 34. Slots 37a, 37b and 37c in the top member 16 permit insertion of the members 36a, 36b and 36c, respectively, from above. Similar slots are also provided in shelves 18a and 18b and the bottom member 19.

Figure 5A:
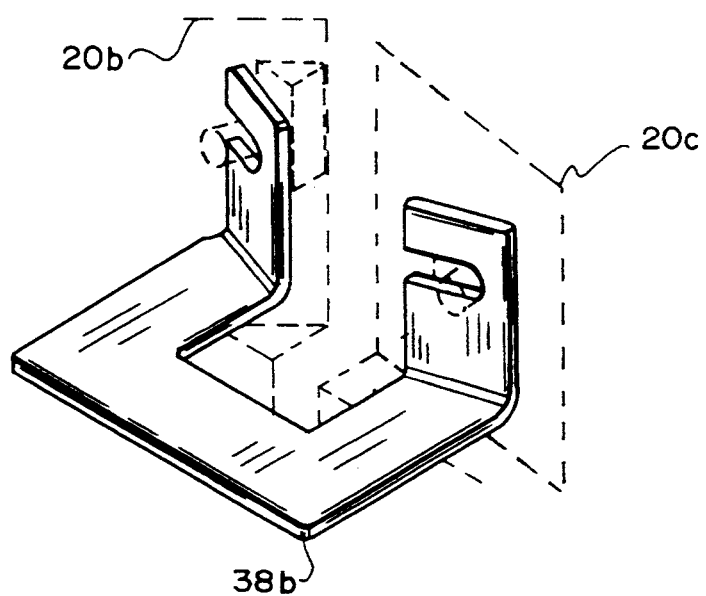
FIGS. 5A, 5B and 5C are enlarged views of various types of bus bars used to connect the terminals of the batteries shown in FIGS. 2A and 2B.
Figure 5B:
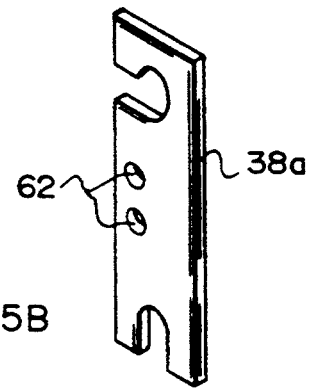
Figure 5C:
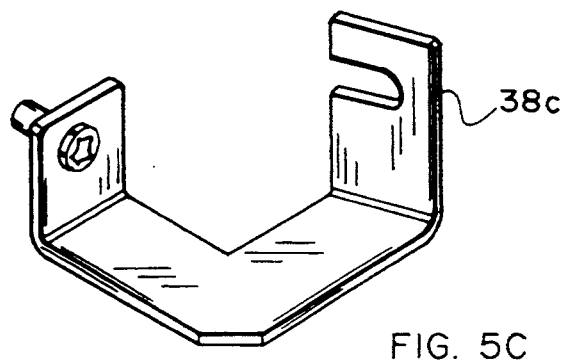

A bus bar 38a, which electrically connects the lower terminal of battery 20e to the upper terminal of battery 20h, is visible through transparent member 36b. Bus bars of varying shapes, discussed in detail below in connection with FIGS. 5A, 5B and 5C, are preferably used to connect the batteries 20 in series and to interconnecting wires.

Figure 2B:
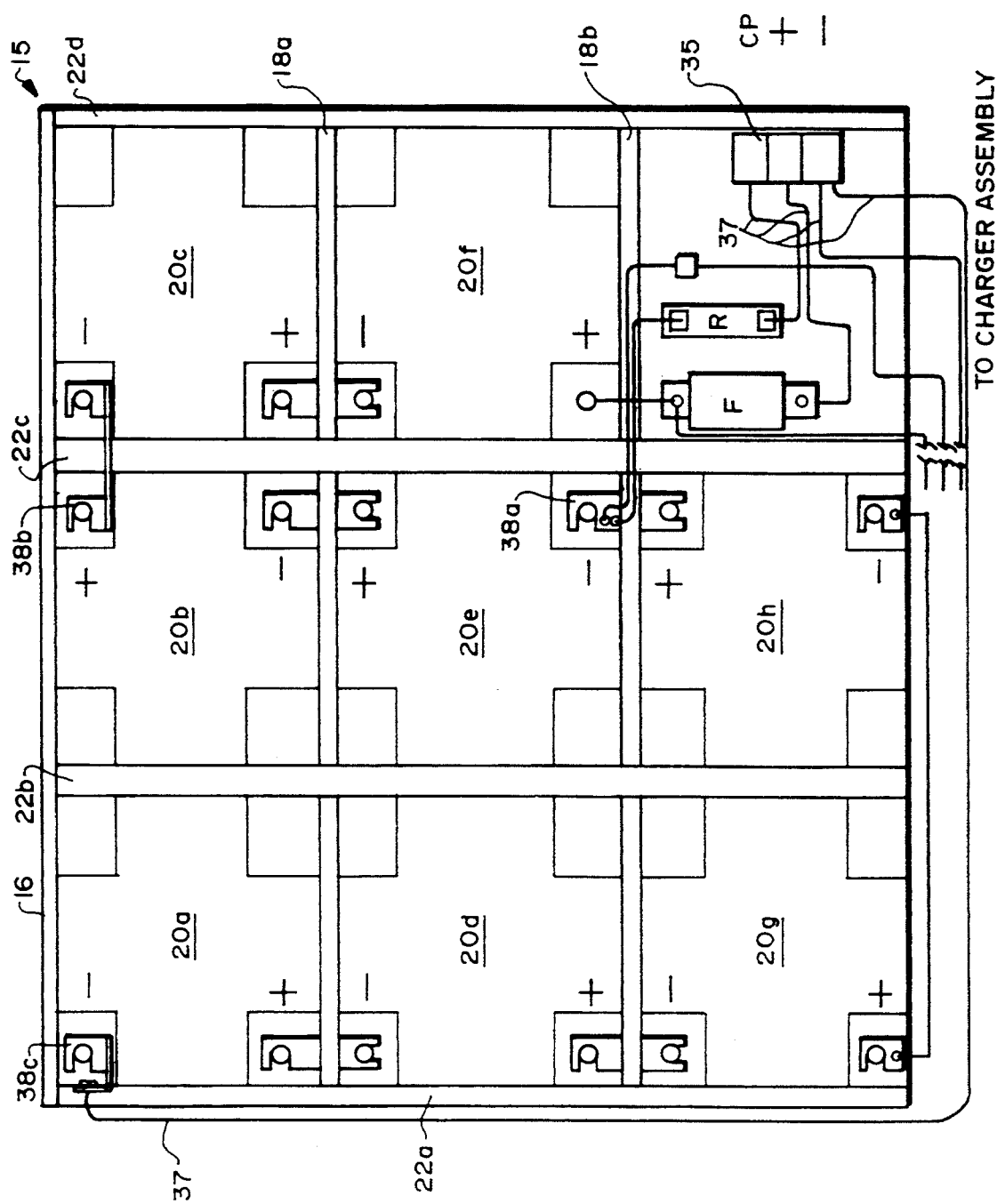
FIG. 2B is a side elevation of the batteries shown in FIG. 2A with schematic illustration of various electrical interconnections.

FIG. 2B shows the battery housing 15 of FIG. 2A with several portions removed and schematically illustrates the electrical interconnections between the batteries 20a–20h and the output power connector 35. The batteries 20a–20h are connected in series and are advantageously arranged such that terminals of opposite polarity are adjacent to each other, thereby providing a minimum distance for a terminal-to-terminal connection. Many of the terminal-to-terminal connections are thus made by bus bars such as bus bar 38a. A bus bar 38b is shaped to span the vertical support 22c and provide a terminal-to-terminal connection between batteries 20b and 20c. A bus bar 38c is shaped to secure an interconnecting wire 39 to the negative terminal of battery 20a.

The output power connector 35 includes a negative terminal (−), a positive terminal (+) and a center tap or center position terminal (CP). The negative terminal is connected by two wires 37 to the charger assembly and to the bus bar 38c, respectively. The positive terminal is connected via a fuse F to the positive terminal of battery 20f. The CP terminal is connected via a load resistor R to the bus bar 38a.

Figure 3C:
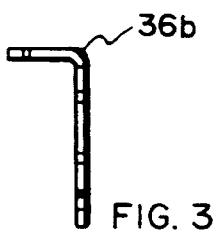
FIGS. 3A, 3B and 3C show various enlarged views of one of the insulating and retaining members shown in FIG. 2A.
Figure 3B:
Figure 3A:
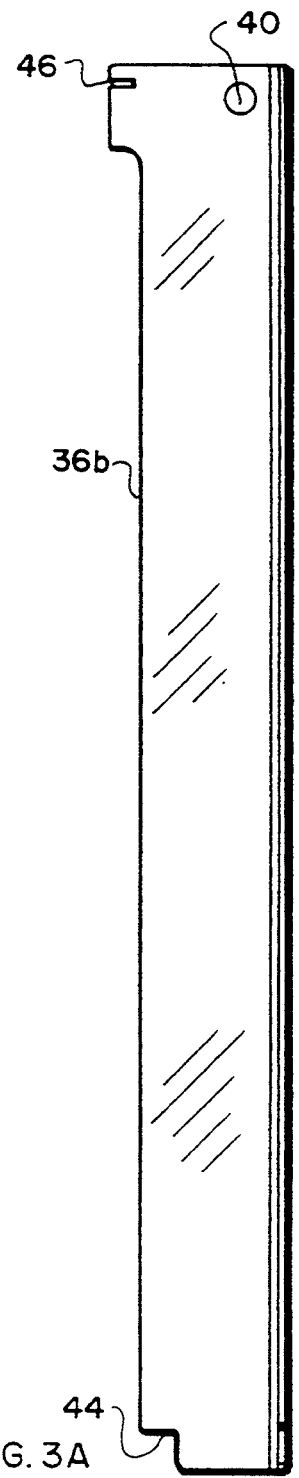

FIGS. 3A, 3B and 3C are enlarged views of insulating and retaining member 36b. An aperture 40 disposed in the upper end of the member 36b is provided for improved ease of handling during installation or removal of the member 36b from the battery housing 15. Notches 42 and 44 abut the bottom member 19 (FIG. 2A) when member 36b is installed, thereby preventing the member 36b from sliding downwardly. A notch 46, located near the top edge of the member 36b, is shaped to engage with a tab which extends inwardly within slot 37b, thereby preventing the member 36b from moving upwardly and essentially locking the member in place.

Member 36b is preferably L-shaped in cross-section, which advantageously increases the stiffness of the member, as well as allowing the member to restrict movement of the batteries 20 in two axes (i.e., sideways within the compartments and forward out of the compartments). Members 36a, 36b and 36c are preferably constructed from a polycarbonate material, which is both transparent and a good insulator. Material sold under the trademark LEXAN is suitable. Transparency is preferred so that, for example, a technician may visually inspect the battery terminals, bus bars and the like without removing the members. If desired, small through holes may be placed in the members, in alignment with the battery terminals, for test purposes. For maximum safety, such holes should be large enough to accommodate a test probe, but not large enough to admit a finger.

Turning now to FIGS. 4A and 4B, the stabilizer 24b is shown in the retracted position. A lower edge 48 of bottom member 19 is shaped to allow the outboard portions of the stabilizers 24 to clear when they retract. An outlock member 53 is disposed adjacent to each stabilizer 24 (only member 53b being visible in FIG. 4A). Outlock member 53b includes a free end 55b which includes a notch 57b shaped to engage the top surface of the stabilizer 24b. A tab 59b permits the free end 55b to move vertically, but prevents lateral movement away from the side of the bottom member 19. A pivot end 61b is preferably pivotally attached to the bottom member 19 by a pin 63b, thereby allowing the free end 55b to move up or down. Thus, when stabilizer 24b is retracted, free end 55b is raised up as shown and the stabilizer 24b is not locked. Conversely, when stabilizer 24b is deployed, free end 55b is urged downward by a spring 65b to rest on top of the stabilizer and lock it in position.

The inboard portion of each stabilizer 24 extends vertically through a corresponding brace 58, the top surface of the bottom member 19 and a retaining member 52. The inboard end of each stabilizer 24 is fitted with a spring 54 which is connected between the retaining member 52 and a pin 56. Each spring 54 creates a torsional biasing force on its associated stabilizer 24. In the absence of a counterbalancing force produced by a guide rail 10, as explained in detail below, this biasing force automatically forces the stabilizer 24 below the lower edge 48 of the bottom member 19. Once clear of the bottom member 19, the stabilizer 24 swings freely outward into a deployed position and locks.

A raceway 60, which extends laterally along the length of the bottom member 19, is provided for routing wires and cables, such as wires 37 in FIGS. 2A and 2B, needed to interconnect the charger assembly 14 and batteries 20 with the output power connector 35 (FIG. 2A).

Referring now to FIGS. 2B, 5A 5B and 5C, various configurations of bus bars are shown which are preferably used to connect battery terminals to each other or to wires or cables, as applicable. Bus bar 38a is used to make a "straight" terminal-to-terminal connection between two terminals of opposite polarity such as those of batteries 20e and 20h. Bus bar 38a also includes two holes 62 which may be used, in combination with conventional lugs or other fasteners (not shown), for connecting wires.

In contrast, bus bar 38b is specially shaped to span the vertical support 22c to connect the upper terminals of batteries 20b and 20c, which are shown in phantom.

Bus bar 38c is shaped to connect the negative terminal of battery 20a and to a wire 37 which is routed to the output power connector 35.

The slots in all of the bus bars 38 are preferably oriented such that each slides easily onto the battery terminals without having to completely remove the terminal screws. Further, such orientation tends to prevent the bars 38 from falling off when the terminal screws are loose.

Figure 6:
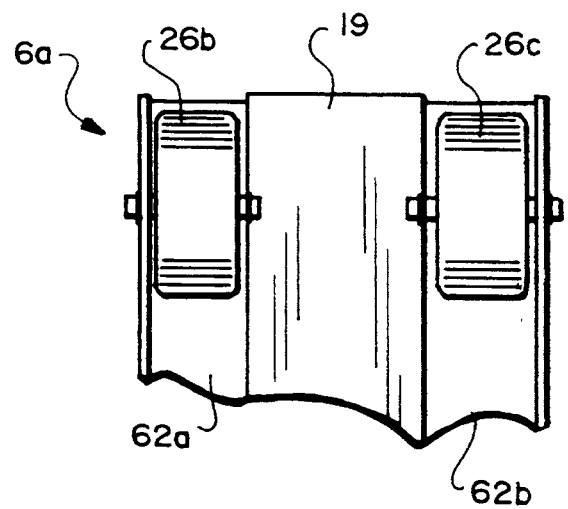
FIG. 6 is a partial bottom plan view of the module shown in FIG. 2A.

FIG. 6 shows an enlarged partial plan view of the bottom of module 6a of FIG. 2A. Bottom member 19 is shaped so as to form to channels or recessed areas 62a and 62b, which provide sufficient clearance to accommodate wheels 26b and 26c. Such clearance advantageously tends to reduce the overall height of the module 6a. Further, the sidewalls of the channels 62a and 62b provide suitable mounting points for the wheels.

Figure 7:
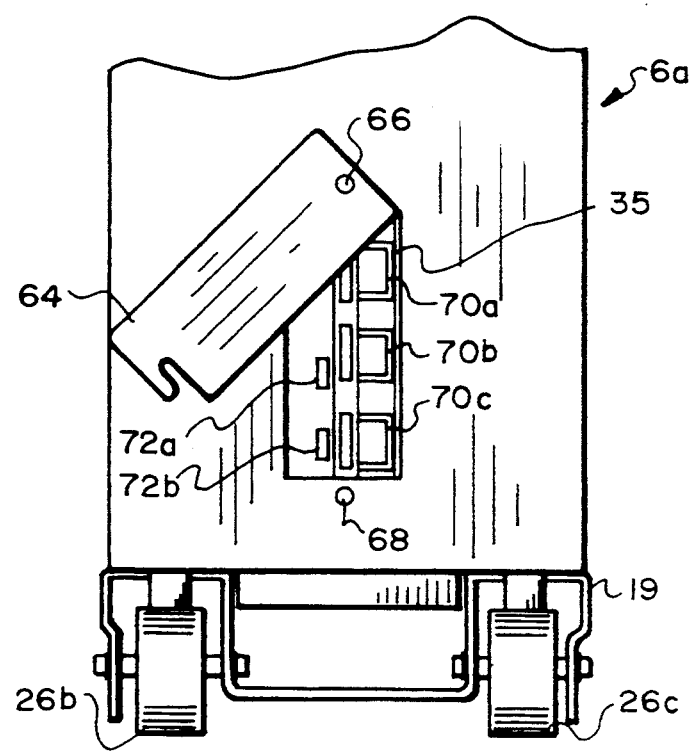
FIG. 7 is a partial end elevation of the module shown in FIG. 2A.

FIG. 7 is a enlarged partial elevation of module 6a showing the output power connector 35 and a rotatable safety cover 64. Cover 64 is preferably pivotally attached at a point 66 and has one end shaped to engage with a post 68 when fully closed. Cover 64 may be closed when the module 6a is free standing outside of its cabinet in order to prevent accidental contact with the energized power connector 35.

Power connector 35 includes three terminals 70a, 70b and 70c and two apertures 72a and 72b. Apertures 72a and 72b are preferably located and shaped to engage with corresponding guide pins (not shown) which are located within the interior of the cabinet 4 (FIG. 1). Thus, when the module 6a is rolled into the cabinet 4, the guide pins engage the apertures 72a and 72b to ensure that power connector 35 is properly aligned with its mate within the cabinet.

Assembly and installation of a module 6 will now be described with reference to FIG. 2A. Assume initially that all of the batteries 20 and members 36 have been removed from the battery housing 15 and that charger assembly 14 is rotated downward as shown in phantom. The stabilizers 24 are deployed. First, batteries 20 are placed into their respective compartments. Bus bars 38 are then used to connect the batteries' terminals. Interconnecting wires or cables are then routed, via the raceway 60 (FIG. 4B), from the charger assembly 14 for connection to an appropriate bus bar 38, battery terminal or the output power connector 35. With the charger assembly 14 rotated downward, access is easily gained to the space between the assembly 14 and housing 15 and the raceway 60, thus expediting the routing of necessary wires or cables. For enhanced safety, a transparent insulating panel (not shown) may cover the portion of the charger assembly 14 which is exposed when the assembly is rotated downward. Such a panel provides protection against shock hazard and also permits visual inspection of the interior of the assembly 14.

The insulating and retaining members 36 are installed next. This is accomplished, for example, by raising the member 36 above the module 6 in a vertical orientation, inserting the edge of the member 36 into the appropriate slot 37 and lowering the member into place. The slot 46 (FIG. 3A) then engages a tab (not shown) within the top member 16. Specifically, the portion of the member 36 immediately below the slot 46 can be easily bent or twisted to clear the tab on the way down and then released to spring back beneath the tab to lock the member in place. The procedure can be used when the member is to be removed. Once installed, the members 36 abut the batteries 20 and inhibit lateral movement of the batteries 20 from their respective compartments. The charger assembly 14 is now rotated to a fully upright position.

Referring now to FIGS. 1 and 2, the module 6 is now ready for installation in the cabinet 4. Using the handle 30, the module 6 is aligned with one of the channels 8. A ramp or pallet may be used as an aid for rolling the module 6 into its channel in the cabinet 4. As the module 6 rolls into the channel, the guide rails 10 eventually make contact with the deployed stabilizers 24. This initial contact exerts an inward force on the stabilizers 24, which force overcomes the torsional bias created by the springs 54 (FIG. 4B) and unlocks the stabilizers 24. As the module 6 continues to roll into the channel, the guide rails 10 exert lateral forces on the unlocked stabilizers 24 which "sweep back" and retract the stabilizers.

Once the module 6 is rolled completely into the cabinet 4, the locking pin 28 may be lowered into a corresponding aperture 12 by manually sliding the lever 33 in a lateral direction.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A power module which is part of a power supply, said power module comprising:
    a load-bearing frame having wheels and defining a plurality of compartments, a plurality of said compartments for holding batteries having external terminals;
    a plurality of elongated insulating members for insulating the terminals of the batteries from the environment external to said compartments and for inhibiting movement of the batteries from the compartments; and
    a plurality of stabilizers secured to said frame and automatically deployable to enhance said power module's mechanical stability when said power module is free-standing and automatically retractable when said power module is inserted into a companion cabinet.

2. The power module as in claim 1 further comprising a battery charger attached to said frame, said charger being electrically connectable with a plurality of said batteries and with input and output power connectors.

3. The power module as in claim 2 wherein said charger is pivotally mounted on said frame, whereby said charger may pivot away from said frame to allow access to a space between said charger and frame.

4. The power module as in claim 1 wherein said batteries are positioned in said compartments such that the terminals are generally vertically aligned and each insulating member comprises an elongated vertically oriented member which is fastened to said frame adjacent to the battery terminals.

5. The power module as in claim 1 wherein said frame includes a bottom portion having a raceway for routing electrical wires within said power module.

6. The power module as in claim 1 further comprising means for locking the power module in a fixed position within a cabinet.

7. The power module as in claim 1 further comprising one or more bus bars for electrically connecting a terminal of one battery to a terminal of another battery or to a wire.

8. The power module as in claim 1 wherein said compartments are generally rectangular in shape and arranged in a series of rows and columns.

9. The power module as in claim 1 wherein said plurality of stabilizers include means for urging the stabilizers into a deployed position when said power module is free-standing and for cooperatingly permitting automatic retraction when said power module is installed within a companion cabinet.

10. The power module as in claim 1 wherein a plurality of apertures formed in the top of said frame permit the insertion and retention of elongated insulating members, said insulating members being capable of sliding upward through said retaining apertures in the top of the frame to provide access to one or more of said batteries.

11. The power module as in claim 1 wherein said power module further comprises:
    stabilizers which are retractable in cooperation with guide tracks within a companion power supply cabinet;
    a power connector with apertures located and shaped to engage with corresponding guide pins located within a companion cabinet;
    a locking pin for securing the power module in the companion cabinet; and
    a handle for manual propulsion of the module.

12. The power module as in claim 11 wherein said module is matingly installable in a companion cabinet, said cabinet including means for automatically compelling the stabilizers into a retracted position when the power module is installed within the cabinet.

13. A mechanically integrated power module for holding a plurality of batteries and battery charger, said power module being part of a power supply and comprising:
    a load-bearing frame having wheels and defining a plurality of compartments, a plurality of said compartments for holding rechargeable batteries having external terminals;
    a battery charger secured to said frame, said charger electrically connected with at least one rechargeable battery and with input and output power connectors;
    a plurality of elongated insulating members for insulating the terminals of the batteries from the environment external to the compartments and for inhibiting movement of said batteries from the compartments; and
    a plurality of stabilizers mechanically secured to said frame and automatically deployable when said power module is free-standing to enhance mechanical stability and automatically retractable when said power module is inserted in a companion cabinet.

14. The power module as in claim 13 wherein said charger is pivotally mounted on said frame, whereby said charger may pivot away from said frame to allow access to a space between said charger and frame.

15. The power module as in claim 13 wherein said batteries are positioned in said compartments such that the terminals are generally vertically aligned and each insulating member comprises an elongated vertically oriented member which is fastened to said frame adjacent to the battery terminals.

16. The power module as in claim 13 wherein said frame includes a bottom portion having a raceway for routing electrical wires within said power module.

17. The power module as in claim 13 further comprising means for locking the power module in a fixed position within a cabinet.

18. The power module as in claim 13 further comprising one or more bus bars for electrically connecting a terminal of one battery to a terminal of another battery or to a wire.

19. The power module as in claim 13 wherein said plurality of stabilizers include means for urging the stabilizers into a deployed position when said power module is free-standing and for cooperatingly permitting automatic retraction when said power module is inserted into a companion cabinet.

20. The power module as in claim 13 wherein a plurality of apertures formed in the top of said frame permit insertion and retention of elongated insulating members and said elongated insulating members are capable of sliding upward through said retaining apertures in the top of the frame to provide access to one or more of said batteries.

21. The power module as in claim 13 wherein said mechanically integrated power module and battery charger further comprise:
   stabilizers which are retractable in cooperation with guide tracks within the companion power supply cabinet;
   a power connector with apertures located and shaped to engage with corresponding guide pins located within the companion cabinet;
   a locking pin for securing the module in the companion cabinet and;
   a handle for manual propulsion of the module.

22. A power module which is part of a power supply, said power module comprising:
   a load-bearing frame having wheels and defining a plurality of compartments, a plurality of said compartments for holding batteries having external terminals and one of said compartments for accommodating an output power connector which is electrically connectable with at least one battery, said frame including a raceway for routing electrical wires between the batteries and the output power connector;
   a plurality of elongated insulating members for insulating the terminals of the batteries in the compartments and for inhibiting movement of said batteries from the compartments; and
   a plurality of stabilizers mechanically secured to said frame and automatically deployable when said power module is free-standing to enhance said power module's mechanical stability and automatically retractable when said power module is inserted into a companion cabinet.

23. The power module as in claim 22 further comprising a battery charger attached to said frame, said charger being electrically connectable with one or more of said batteries and with an input power connector and the output power connector.

24. The power module as in claim 23 wherein said charger is pivotally mounted on said frame, whereby said charger may pivot away from said frame to allow access to a space between said charger and frame.

25. The power module as in claim 22 wherein said batteries are positioned in said compartments such that the terminals are generally vertically aligned and each insulating member comprises an elongated vertically oriented member which is fastened to said frame adjacent to the battery terminals.

26. The power module as in claim 21 wherein said module is matingly installable in a companion cabinet, said cabinet including means for automatically compelling said stabilizers into a retracted position when the module is installed within the cabinet.

27. The power module as in claim 22 further comprising means for locking the power module in a fixed position within a cabinet.

28. The power module as in claim 22 further comprising one or more bus bars for electrically connecting a terminal of one battery to a terminal of another battery or to a wire.

29. The power module as in claim 22 wherein said plurality of stabilizers include means for urging the stabilizers into a deployed position when said power module is free-standing and for cooperatingly permitting automatic retraction when said power module is inserted in a companion cabinet.

30. The power module as in claim 22 wherein a plurality of apertures formed in the top of said frame permit insertion and retention of elongated insulating members and said elongated insulating members are capable of sliding upward through the retaining apertures in the top of said frame in order to provide access to one or more of said batteries.

31. The power module as in claim 22 wherein said power module further comprises:
   stabilizers which are retractable in cooperation with guide tracks within the companion power supply cabinet;
   a power connector with apertures located and shaped to engage with corresponding guide pins located within the companion cabinet;
   a locking pin for securing the module in the companion cabinet and;
   a handle for manual propulsion of the module.

32. The power module in claim 31 wherein said module is matingly installable in a companion cabinet, the cabinet including means for automatically compelling the stabilizers into a retracted position when the module is installed within the cabinet.

* * * * *